(12) United States Patent
Megrant (10) Patent No.: US 10,770,307 B2
(45) Date of Patent: Sep. 8, 2020

(54) BUFFER LAYER TO PREVENT ETCHING BY PHOTORESIST DEVELOPER

(71) Applicant: Google LLC, Mountain View, CA (US)

(72) Inventor: Anthony Edward Megrant, Mountain View, CA (US)

(73) Assignee: Google LLC, Mountain View, CA (US)

(*) Notice: Subject to any disclaimer, the term of this patent is extended or adjusted under 35 U.S.C. 154(b) by 0 days.

(21) Appl. No.: 16/332,998

(22) PCT Filed: Sep. 13, 2016

(86) PCT No.: PCT/US2016/051464
§ 371 (c)(1),
(2) Date: Mar. 13, 2019

(87) PCT Pub. No.: WO2018/052397
PCT Pub. Date: Mar. 22, 2018

(65) Prior Publication Data
US 2019/0227439 A1    Jul. 25, 2019

(51) Int. Cl.
*H01L 21/3205* (2006.01)
*G03F 7/09* (2006.01)
(Continued)

(52) U.S. Cl.
CPC ...... *H01L 21/32058* (2013.01); *C09D 133/12* (2013.01); *G03F 7/094* (2013.01);
(Continued)

(58) Field of Classification Search
CPC ......... H01L 21/28026; H01L 21/32058; H01L 21/76891; H01L 27/18; H01L 29/437;
(Continued)

(56) References Cited

U.S. PATENT DOCUMENTS 4,616,400 A * 10/1986 Macksey ............. H01L 21/0272
257/E21.025
4,869,598 A *  9/1989 McDonald ............. G01K 7/006
374/176
(Continued)

FOREIGN PATENT DOCUMENTS

EP    341501    11/1989
EP    397186    11/1990
(Continued)

OTHER PUBLICATIONS

PCT International Search Report and Written Opinion in International Application No. PCT/US2016/051464, dated Jun. 8, 2017, 13 pages.
(Continued)

*Primary Examiner* — Eduardo A Rodela
(74) *Attorney, Agent, or Firm* — Fish & Richardson P.C.

(57) ABSTRACT

A method includes: providing a device having a first layer and a second layer in contact with a surface of the first layer, in which the second layer includes a first superconductor material; forming a buffer material on the second layer to form an etch buffer layer, in which an etch rate selectivity of the buffer material relative to the second layer upon exposure to a photoresist developer is such that the underlying second layer is not etched during exposure of the buffer layer to the photoresist developer; depositing and removing a selected portion of a resist layer to uncover a first portion of the etch buffer layer, wherein removing the selected portion of the resist layer comprises applying the photoresist developer to the selected portion of the resist layer.

10 Claims, 5 Drawing Sheets

(51) Int. Cl.
| | |
|---|---|
| *H01L 39/24* | (2006.01) |
| *H01L 39/00* | (2006.01) |
| *H01L 27/18* | (2006.01) |
| *H01L 29/43* | (2006.01) |
| *H01L 21/28* | (2006.01) |
| *H01L 21/768* | (2006.01) |
| *G03F 7/11* | (2006.01) |
| *C09D 133/12* | (2006.01) |
| *G03F 7/16* | (2006.01) |
| *G03F 7/20* | (2006.01) |
| *G03F 7/32* | (2006.01) |
| *H01L 39/12* | (2006.01) |

(52) U.S. Cl.
CPC ............... *G03F 7/11* (2013.01); *G03F 7/16* (2013.01); *G03F 7/2002* (2013.01); *G03F 7/2004* (2013.01); *G03F 7/32* (2013.01); *H01L 21/28026* (2013.01); *H01L 21/76891* (2013.01); *H01L 27/18* (2013.01); *H01L 29/437* (2013.01); *H01L 39/00* (2013.01); *H01L 39/12* (2013.01); *H01L 39/24* (2013.01); *H01L 39/2403* (2013.01); *H01L 39/2493* (2013.01)

(58) Field of Classification Search
CPC ......... H01L 39/00; H01L 39/12; H01L 39/14; H01L 39/24; H01L 39/2403; H01L 39/249; H01L 39/2493
See application file for complete search history.

(56) References Cited

U.S. PATENT DOCUMENTS

| | | | | |
|---|---|---|---|---|
| 2006/0183348 | A1* | 8/2006 | Meagley | H01L 21/0276 438/789 |
| 2011/0287944 | A1* | 11/2011 | Folk | H01L 27/18 505/329 |
| 2013/0119351 | A1* | 5/2013 | Shea | H01L 39/223 257/31 |
| 2017/0117476 | A1* | 4/2017 | Kim | H01L 51/5225 |
| 2017/0261850 | A1* | 9/2017 | Stowers | G03F 7/0035 |
| 2019/0288176 | A1* | 9/2019 | Yoscovits | H01L 39/2493 |
| 2019/0296214 | A1* | 9/2019 | Yoscovits | H01L 39/025 |

FOREIGN PATENT DOCUMENTS

| | | |
|---|---|---|
| JP | H03-080577 | 4/1991 |
| JP | H06-268271 | 9/1994 |
| JP | 2538096 | 9/1996 |
| JP | 5141858 | 2/2013 |
| JP | 2013-526015 | 6/2013 |
| KR | 10-2001-0067425 | 7/2001 |

OTHER PUBLICATIONS

PCT International Preliminary Report on Patentability in International Application No. PCT/US2016/051464, dated Mar. 28, 2019, 7 pages.
JP Office Action in Japanese Appln. No. 2019-513965, dated Mar. 23, 2020, 11 pages (with English translation).
KR Office Action in Korean Appln. No. 10-2019-7009333, dated Jul. 1, 2020, 13 pages (with English translation).

* cited by examiner

BUFFER LAYER TO PREVENT ETCHING BY PHOTORESIST DEVELOPER

CROSS-REFERENCE TO RELATED APPLICATION

This application is a National Stage Application under 35 U.S.C. § 371 and claims the benefit of International Application No. PCT/US2016/051464, filed Sep. 13, 2016, the disclosure of which is incorporated herein by reference.

TECHNICAL FIELD

The present disclosure relates to buffer layers for preventing etching by a photoresist developer.

BACKGROUND

Quantum computing is a relatively new computing method that takes advantage of quantum effects, such as superposition of basis states and entanglement to perform certain computations more efficiently than a classical digital computer. In contrast to a digital computer, which stores and manipulates information in the form of bits (e.g., a "1" or "0"), quantum computing systems can manipulate information using qubits. A qubit can refer to a quantum device that enables the superposition of multiple states (e.g., data in both the "0" and "1" state) and/or to the superposition of data, itself, in the multiple states. In accordance with conventional terminology, the superposition of a "0" and "1" state in a quantum system may be represented, e.g., as $\alpha|0\rangle + \beta|1\rangle$. The "0" and "1" states of a digital computer are analogous to the $|0\rangle$ and $|1\rangle$ basis states, respectively of a qubit. The value $|\alpha|^2$ represents the probability that a qubit is in $|0\rangle$ state, whereas the value $|\beta|^2$ represents the probability that a qubit is in the $|1\rangle$ basis state.

SUMMARY

In general, in a first aspect, the subject matter of the present disclosure may be embodied in methods of fabricating a quantum circuit device, the methods including: providing a device having a first layer and a second layer in contact with a surface of the first layer, in which the second layer includes a first superconductor material that exhibits superconducting properties at or below a corresponding superconducting critical temperature; forming a buffer material on a surface of the second layer to form an etch buffer layer, in which an etch rate selectivity of the buffer material relative to the second layer upon exposure to a photoresist developer is such that the underlying second layer is not etched during exposure of the buffer layer to the photoresist developer; depositing and removing a selected portion of a resist layer to uncover a first portion of the etch buffer layer, wherein removing the selected portion of the resist layer comprises applying the photoresist developer to the selected portion of the resist layer.

Implementations of the methods may include one or more of the following features. For example, in some implementations, the etch rate selectivity of the buffer material relative to the second layer upon exposure to the photoresist developer is less than 1:2.

In some implementations, the first superconductor material of the second layer is aluminum.

In some implementations, the buffer material includes a polymer. The polymer may include polymethylmethacrylate (PMMA).

In some implementations, the methods further include removing the uncovered first portion of the etch buffer layer to uncover a first portion of the second layer. Removing the uncovered first portion of the etch buffer layer may include subjecting the uncovered first portion of the etch buffer layer to a dry etch. The dry etch includes an $O_2$ plasma. The methods may further include etching the uncovered first portion of the second layer. The etched second layer may form part of the quantum circuit device, in which the quantum device includes a qubit, a qubit measurement resonator, a superconducting quantum interference device, a superconducting coupler, or a superconducting co-planar waveguide. The methods may further include removing, subsequent to etching the uncovered first portion of the second layer, a remaining portion of the resist layer and the etch buffer layer. The methods may further include forming a dielectric material or a second superconductor material, which exhibits superconducting properties at or below a corresponding superconducting temperature, on the uncovered first portion of the second layer. The second layer and the dielectric material or the second layer and the second superconductor material may form part of the quantum circuit device. The quantum circuit device may include a parallel plate capacitor, a microstrip resonator, or a transmission line. The methods may further include removing, subsequent to depositing the dielectric material or the second superconductor material, a remaining portion of the resist layer and the etch buffer layer.

In some implementations, the first layer includes a substrate. The substrate may include a silicon wafer or a sapphire wafer.

Implementations may include one or more of the following advantages. For example, in some implementations, the buffer material prevents developer from attacking underlying material, such as aluminum, thus preventing removal or damage of the underlying material. Moreover, as a result, in some implementations, it is not necessary to use weaker developer solutions, which may require longer development times. Alternatively, stronger and faster developer solutions may be used without concern that the material underlying the buffer layer will be attacked. Additionally, in some implementations, the buffer material itself etches much faster than photoresist under certain etching methods, such as $O_2$ ashing, such that the buffer material may be removed without concern that the photoresist regions defining various aspects of the device to be fabricated will be damaged.

For the purposes of this disclosure, a superconductor (alternatively, superconducting) material may be understood as a material that exhibits superconducting properties at or below a superconducting critical temperature. Examples of superconductor material include, but are not limited to, aluminum (superconducting critical temperature of, e.g., 1.2 kelvin), niobium (superconducting critical temperature of, e.g., 9.3 kelvin) and titanium nitride (superconducting critical temperature of, e.g., 5.6 kelvin).

The details of one or more implementations are set forth in the accompanying drawings and the description below. Other features and advantages will be apparent from the description, the drawings, and the claims.

DETAILED DESCRIPTION

Quantum computing entails coherently processing quantum information stored in the quantum bits (qubits) of a quantum computer. In certain types of quantum computing processors, such as quantum annealers, the qubits of the quantum processor are coupled together in a controllable manner such that the quantum state of each qubit affects the corresponding quantum states of the other qubits to which it is coupled. Superconducting quantum computing is a promising implementation of quantum computing technology in which quantum circuit elements are formed, in part, from superconductor materials. Superconducting quantum computers are typically multilevel systems, in which only the first two levels are used as the computational basis. In certain implementations, quantum circuit elements, such as qubits, are operated at very low temperatures so that superconductivity can be achieved and so that thermal fluctuations do not cause transitions between energy levels. Additionally, it may be preferable that the quantum circuit elements are operated with low energy loss and dissipation (e.g., the quantum circuit elements exhibit a high quality factor, Q). Low energy loss and dissipation may help to avoid, e.g., quantum decoherence.

An example of a superconductor material that can be used in the formation of quantum circuit elements is aluminum. Aluminum may be used in combination with a dielectric to establish Josephson junctions, which are a common component of quantum circuit elements. Examples of quantum circuit elements that may be formed with aluminum include circuit elements such as superconducting co-planar waveguides, quantum LC oscillators, qubits (e.g., flux qubits or charge qubits), superconducting quantum interference devices (SQUIDs) (e.g., RF-SQUID or DC-SQUID), inductors, capacitors, transmission lines, ground planes, among others.

Aluminum may also be used in the formation of superconducting classical circuit elements that are interoperable with superconducting quantum circuit elements as well as other classical circuit elements based on complementary metal oxide semiconductor (CMOS) circuitry. Examples of classical circuit elements that may be formed with aluminum include rapid single flux quantum (RSFQ) devices, reciprocal quantum logic (RQL) devices and ERSFQ devices, which are an energy-efficient version of RSFQ that does not use bias resistors. Other classical circuit elements may be formed with aluminum as well. The classical circuit elements may be configured to collectively carry out instructions of a computer program by performing basic arithmetical, logical, and/or input/output operations on data, in which the data is represented in analog or digital form.

Processing with aluminum may, however, lead to various complications that degrade the performance of the quantum circuit elements (as well as the performance of classical circuit elements). In particular, aluminum on semiconductor substrates may be highly susceptible to etching by photoresist developers that are used to remove soluble photoresist after exposure to light. This is understood to be primarily a result of the galvanic corrosion effect. For instance, in some cases, a 100 nm film of aluminum can be completely etched away if exposed to a common developer (e.g., AZ 300 MIF from AZ Electronic Materials) during a standard 60 second photoresist development step. In other cases, the developer may not etch away the entire aluminum film, but can still lead to significant roughening of the aluminum surface. This roughening may increase the surface loss associated with the aluminum film, which, in turn, may reduce the quality factor, Q, of a circuit element of which the aluminum film is a component. For example, in some implementations, the quality factor of a device using an aluminum surface roughened by developer may be reduced by a factor of two or more (e.g., from a Q of $3*10^6$ to a Q of $1.3*10^6$).

While the examples below are described in the context of aluminum as the material that exhibits superconducting properties below a certain temperature, the processes described below can be applied to a superconducting material that may be susceptible to the galvanic corrosion effects to a degree that causes unacceptable levels of removal without the presence of a buffer material.

Figure 1A:
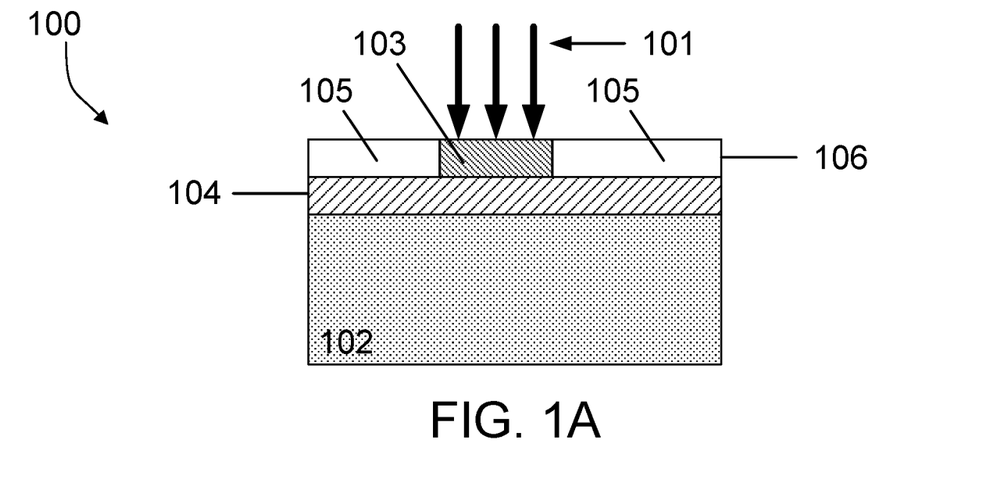
FIGS. 1A-1C are schematics that illustrate cross-section views of an example of a device affected by developer damage to an aluminum film.
Figure 1B:
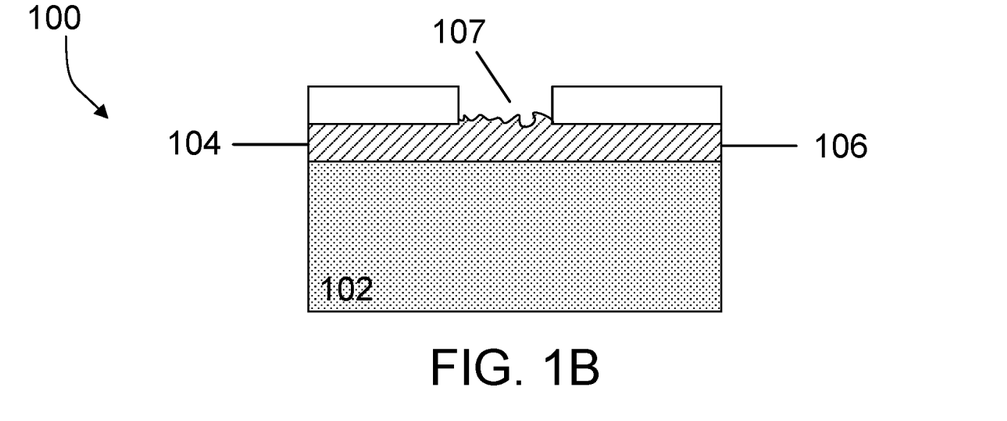
Figure 1C:
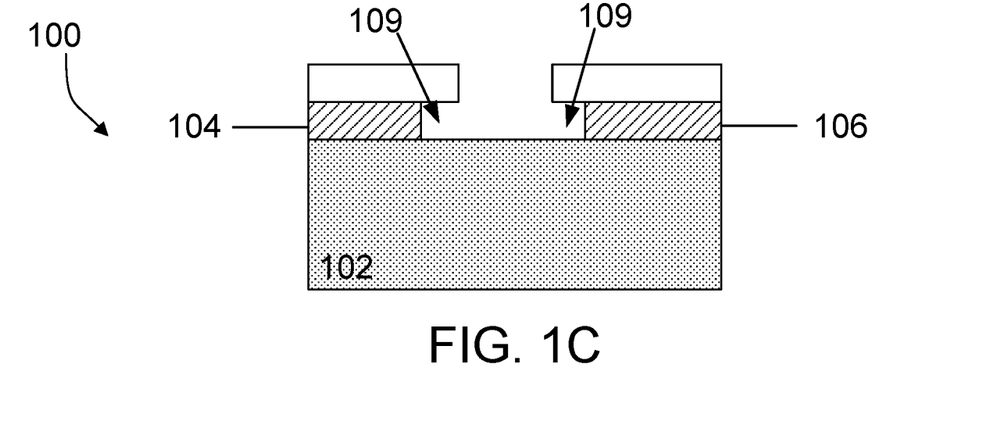

FIGS. 1A-1C are schematics that illustrate cross-section views of an example of a device 100 affected by developer damage to an aluminum film. As shown in FIG. 1a, the device 100 initially includes a silicon substrate 102 on which is formed an aluminum layer 104. A layer of photoresist 106 may be provided on the top surface of the aluminum layer 104. A portion of the photoresist layer 106 may be exposed to, e.g., ultraviolet (UV) light 101, such that the exposed portion 103 is now soluble when a developer is applied to the photoresist. The other portions 105 of the photoresist layer 106 that have not been exposed to the UV light remain insoluble when coming into contact with the developer. The foregoing is an example of a positive type resist. Negative type resists may be used instead, in which the portion of the photoresist that is exposed to UV light becomes insoluble in developer, whereas the unexposed portions remain soluble in developer.

FIG. 1B shows a first type of damage that can occur when the developer is applied to the photoresist after the exposure step. In this image, the exposed portion of photoresist may be removed, but the developer continues to attack the underlying aluminum causing substantial roughness 107 in surface of the aluminum. As explained herein, the increased roughness may lead to a reduction in quality factor of the quantum circuit elements to be formed.

FIG. 1C shows a second type of damage that can occur when the developer is applied to the photoresist after the exposure step. Again, the exposed portion of photoresist may be removed, but the developer completely etches away the underlying aluminum film. Indeed, the etch effect of the developer may be so severe that portions 109 of the aluminum film are etched underneath the regions of photoresist that have not been removed by the developer.

Figure 2:
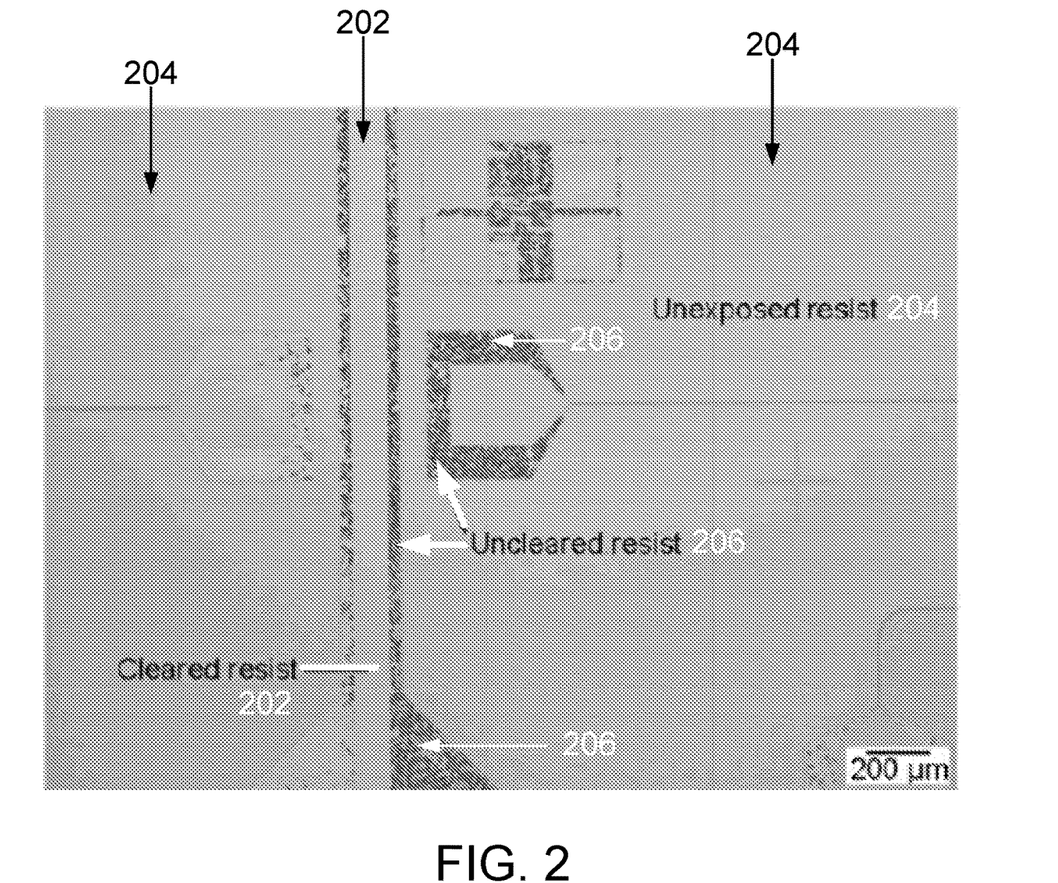
FIG. 2 is a photograph that illustrates a top view of an example of a device affected by a developer that has been diluted.

Though using a weaker developer (e.g., a diluted developer) may, in some cases, reduce the level of aluminum etching, this approach can substantially increase the time necessary to develop a photoresist layer. Moreover, diluting the developer renders removing all of the undesired photoresist more difficult. FIG. 2 is a photograph that illustrates a top view of an example of a device affected by a developer that has been diluted. Three separate areas are evident in the photograph: a first region 202 where UV exposed photoresist has been removed entirely by a diluted developer to reveal an underlying aluminum layer, a second region 204 where unexposed resist remains covering the underlying aluminum layer, and a third region 206 where UV exposed resist has not been cleared by the weakened developer. In some implementations, the uncleared resist, such as the resist in region 206, remains regardless of how long the development time is, thus destroying the usability of the wafer.

The present disclosure relates to adding a buffer layer to the fabrication process to prevent the developer attack/etching of films, such as aluminum. Using aluminum as an example type of film to be protected, the buffer layer has a developer etch rate selectivity that may be much lower relative to aluminum and may be positioned between the aluminum film and an overlying photoresist layer during the fabrication process. Accordingly, once the developer removes the undesired photoresist, only the buffer layer, and not the aluminum layer, may be exposed to the developer solution. The buffer layer thus serves to protect the underlying aluminum layer. Additionally, given the low etch rate selectivity of the buffer layer in the presence of the developer, the buffer layer is not significantly etched. After performing photolithography and development, the exposed portion of the buffer layer may be removed to allow for deposition of further materials onto the underlying aluminum layer or to allow for removal of the underlying aluminum layer.

Figure 3A:
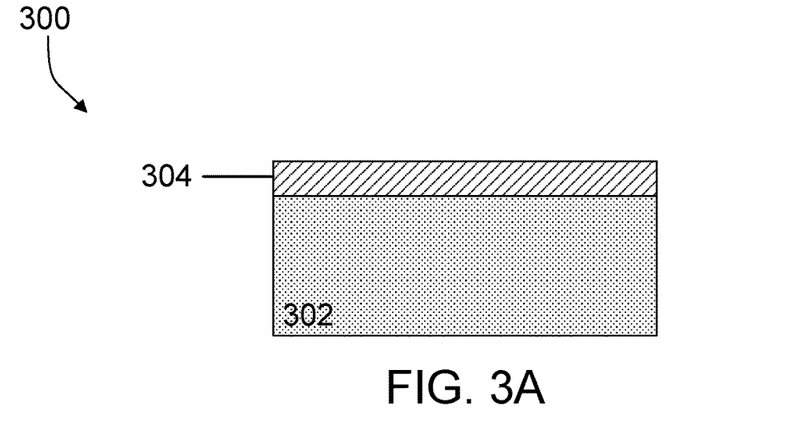
FIGS. 3A-3G are schematics illustrating an example of a process that utilizes a buffer layer to protect an underlying aluminum layer from etching by a developer solution.
Figure 3B:
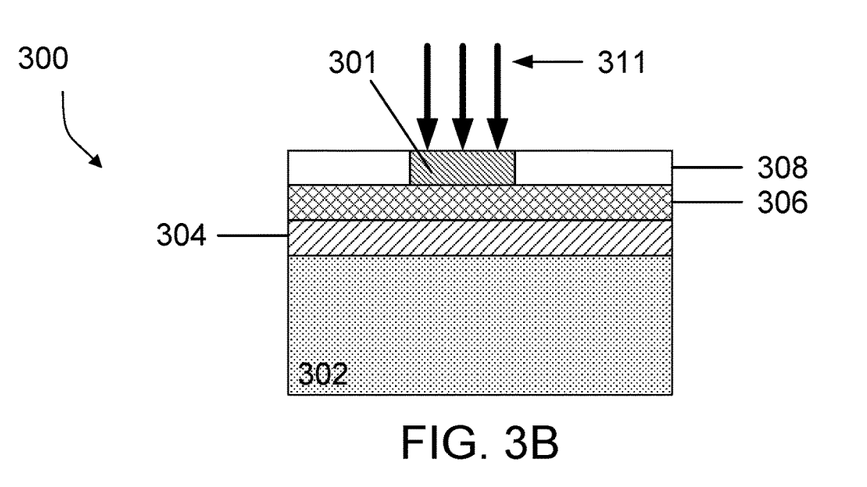

FIGS. 3A-3F are schematics illustrating an example of a process that utilizes a buffer layer to protect an underlying aluminum layer from etching by a developer solution. First, as shown in FIG. 3A, a device 300 is provided, in which the device 300 includes a substrate 302 on which a thin film 304 of aluminum may be formed. In the present example, the aluminum film has a thickness of 100 nm, though other thicknesses may be used as well. The substrate 302 may include, e.g., a silicon or sapphire wafer. Next, as shown in FIG. 3B, a buffer layer 306 may be formed on the top surface of the aluminum layer 304. The buffer layer 306 includes a material that may be highly resistant to etching by common photoresist developers. For example, the buffer layer 306 may include an insulating electric polymer film, such as polymethylmethacrylate (PMMA). An etch rate selectivity of the buffer material relative to aluminum upon exposure to a photoresist developer may be, e.g., less than 1:2, less than 1:3, less than 1:4, less than 1:5, less than 1:6, less than 1:10, less than 1:20, or less than 1:40. The buffer material may have other values for etch rate selectivity relative to aluminum in the presence of photoresist developer. More generally, the ratio may be such that the underlying aluminum is not etched during exposure of the buffer layer to the photoresist developer. As used herein, a superconductor is not etched during exposure if superconductor is not removed and the surface of superconductor is not roughened to the point that the roughening affects the qualitative performance of the circuit for given performance requirements.

The buffer layer 306 may be deposited on the top surface of the aluminum layer 304 in liquid form using, e.g., a spin coater. As an example process, PMMA may be deposited on the aluminum film in liquid form and then spin coated at 8 krpm. Following spinning, the device 100 then may be post-baked at 200° C. for about 2 min on a hot plate to provide a PMMA film that is several nanometers thick. Other spin-coating speeds and post-bake times may be used to achieve different thicknesses for the buffer layer 306.

Following deposition of the buffer layer 306, a photoresist layer 308 then may be formed on the surface of the buffer layer 306, as also shown in FIG. 3B. At least a portion 301 of the photoresist layer 308 then may be exposed to light 311 (e.g., UV or DUV), causing a chemical change in the exposed resist such that the exposed resist becomes either soluble to photoresist developer or insoluble to photoresist developer.

Figure 3C:
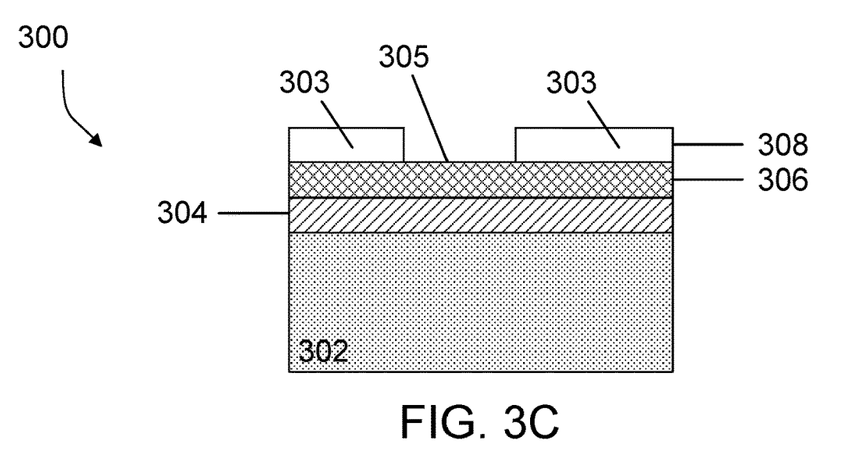

A developer then may be applied to the top surface of the device 100 containing the photoresist layer 308 that has been exposed to light. For positive-type photoresist, the developer removes the photoresist in the region 301 that absorbed the incident light, while leaving the unexposed photoresist 303 remaining on the surface of the buffer layer 306 as shown in FIG. 3C. For negative-type photoresist, the developer removes the portions of photoresist outside of the region 301, while leaving the region 301 in place on the buffer layer 306. The portion 305 of the buffer layer 306 that comes into contact with the developer solution during this step is not etched (or is not substantially etched). Rather, as shown in FIG. 3C, the buffer layer 306, including the region 305 that comes into contact with the developer solution, serves as a barrier preventing the developer from reaching the underlying aluminum layer 304, and thus protecting the aluminum 304 from being etched.

Figure 3D:
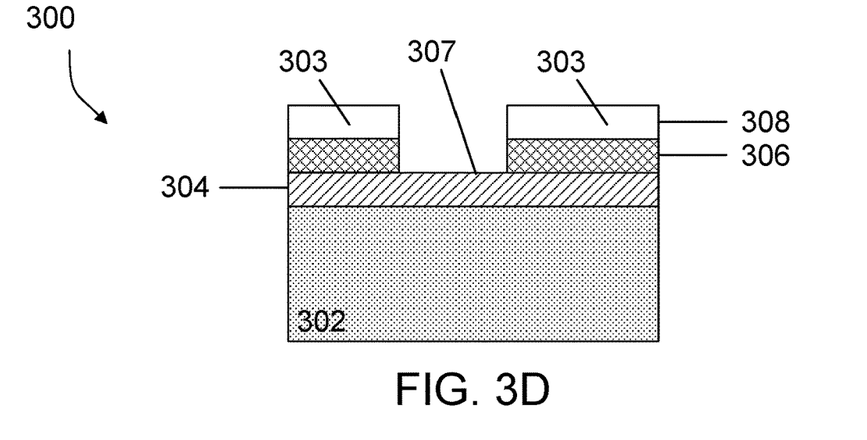

The portion 305 of the buffer layer 306 that is bare/uncovered due to the removal of photoresist then may be itself removed as shown in FIG. 3D. In the present example, the buffer layer 306 includes PMMA and may be removed using $O_2$ ashing to expose/uncover a region 307 of the underlying aluminum layer 304. In $O_2$ ashing, monatomic oxygen plasma is created by exposing oxygen gas at a low pressure to high power radio waves. The reactive oxygen then combines with the PMMA to form ash, which is removed with a vacuum pump. Although $O_2$ ashing also removes photoresist, PMMA has a much higher etch rate selectivity compared to photoresist. For example, PMMA may have an etch rate selectivity for $O_2$ ashing relative to photoresist of greater than 3:1. Accordingly, $O_2$ ashing may be an effective technique for removing the PMMA buffer layer 306 without substantially removing the patterned photoresist layer. Other techniques for removing the buffer layer 306 may be used as well. The etch selectivity of a technique for removing the buffer layer 306 should be high enough that the patterned photoresist layer 308 is not removed or substantially degraded during etch of the buffer layer 306.

Figure 3E:
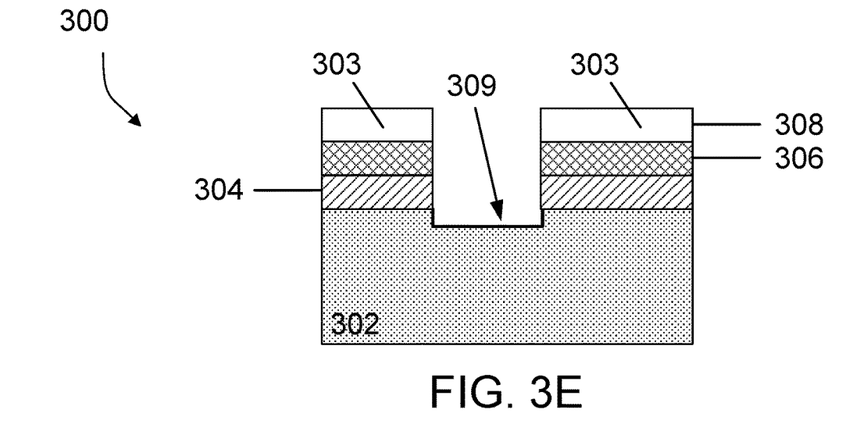

Following the removal of the portion 305 of the buffer layer 306, further processing of the device 100 may include etching and/or material deposition. For example, in some implementations, the patterned photoresist/buffer layers may define a bare/uncovered region 307 of the aluminum layer 304 for etching. Etching of the region 307 of the aluminum layer 304 may continue until the layer beneath the aluminum film 304 (e.g., the substrate 302) is reached. For instance, a wet etchant, such as etchants available from Transene Company, Inc. may be used to remove the aluminum. In some implementations, the layer (e.g., substrate 302) beneath the aluminum film 304 also may be etched using the film 304 as a mask. For example, as shown in FIG. 3E, a portion 309 of the substrate 302 may be etched following removal of the aluminum region 307. In some implementations, the entirety of the buffer layer 306 and the photoresist layer 308 are removed after etching the region 307 of aluminum film 304. The photoresist may be removed using, for example, a solvent (e.g., acetone or dimethyl sulfoxide) or photostripper (e.g., AZ® 100 remover). The buffer layer 306 may be removed using $O_2$ as detailed herein. In some implementations, the remaining photoresist layer 308 is removed before etching the layer 304.

Figure 3F:
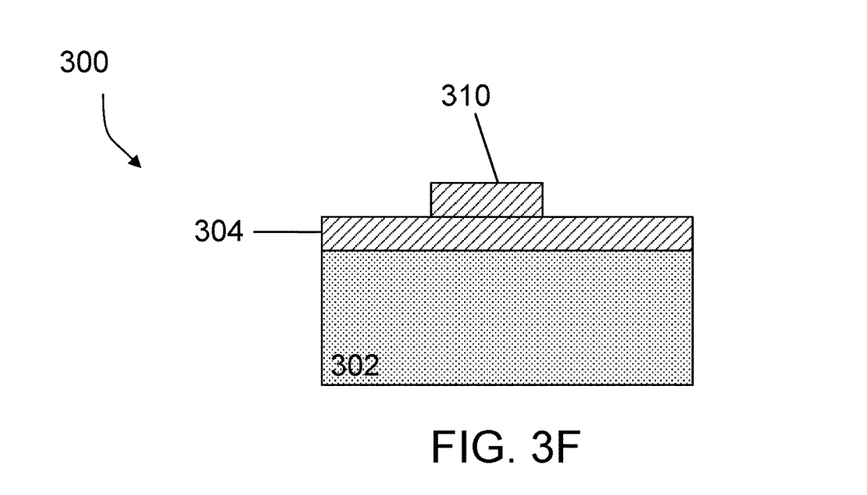
Figure 3G:
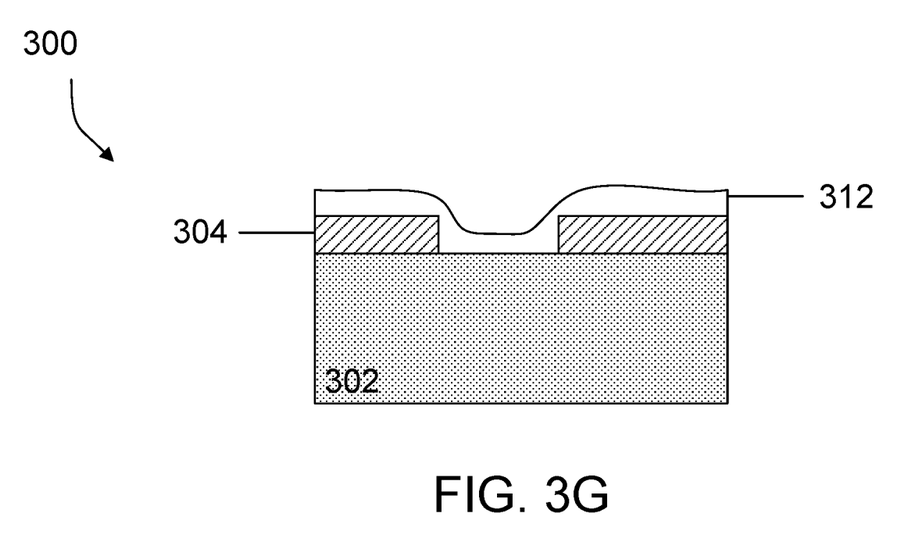

Alternatively, or in addition to the etch process steps, material may be added to the device 100 following removal of the portion 305 of the buffer layer 306. For example, in some implementations, a layer of superconductor material (e.g., aluminum, niobium or titanium nitride) may be deposited on the uncovered region 307 of the aluminum layer 304 and on the photoresist/buffer layer stack. Portions of the deposited superconductor on the photoresist/buffer layers 306/308 may then be removed using, e.g., a lift-off process. A remaining portion 310 of superconductor material, having a width defined by the now-removed photoresist/buffer layers 306/308 remains on the surface of aluminum layer 304, as shown in FIG. 3F. Alternatively or in addition, in some implementations, a dielectric material (e.g., an electrically insulating material) may be deposited on the uncovered region 307 of the aluminum layer 304 and on the photoresist/buffer layer stack. The dielectric material may include, e.g., amorphous or poly-crystalline silicon or silicon dioxide. Other materials may be deposited as well. Alternatively, in some implementations, material may be added to the device 100 following the removal of the portion 307 of the aluminum layer 304. For example, a superconductor, dielectric or metal may be deposited on an uncovered portion of the substrate 302 following etching of aluminum, but prior to the removal of the photoresist/buffer stack. Again, a lift-off process may be used to remove the portions of the material arranged on the photoresist/buffer layer. Alternatively, the photoresist and buffer layer may be removed prior to deposition of the new layer of material. For example, FIG. 3G is a schematic that illustrates an example of device 300, in which a conformal dielectric 312, such as silicon dioxide or amorphous silicon, may be deposited (using, e.g., chemical vapor deposition) on a surface of the aluminum layer 304, after the aluminum has been etched to expose a portion of the underlying substrate 302.

Though the present disclosure describes examples of a buffer layer for protecting aluminum films against etching by a developer solution, a buffer layer may also be used to protect other films/materials that are susceptible to substantial etching by a developer solution (e.g., zinc or other materials susceptible to galvanic corrosion).

As explained herein, the aluminum layer (or other layer) that is protected from etching by the developer solution by the buffer material may be used as part of a quantum circuit element or a classical circuit element. Additional layers and components can be formed, added and/or etched by repeating one or more of the process steps described herein with respect to FIGS. 3A-3G one or more times.

Processes described herein may entail the deposition of one or more materials, such as superconductors, dielectrics and/or metals. Depending on the selected material, these materials may be deposited using deposition processes such as chemical vapor deposition, physical vapor deposition (e.g., evaporation or sputtering), or epitaxial techniques, among other deposition processes. Processes described herein may also entail the removal of one or more materials from a device during fabrication. Depending on the material to be removed, the removal process may include, e.g., wet etching techniques, dry etching techniques, or lift-off processes.

Implementations of the quantum subject matter and quantum operations described in this specification may be implemented in suitable quantum circuitry or, more generally, quantum computational systems, including the structures disclosed in this specification and their structural equivalents, or in combinations of one or more of them. The term "quantum computational systems" may include, but is not limited to, quantum computers, quantum information processing systems, quantum cryptography systems, or quantum simulators.

The terms quantum information and quantum data refer to information or data that is carried by, held or stored in quantum systems, where the smallest non-trivial system is a qubit, e.g., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states are possible. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Quantum circuit elements may be used to perform quantum processing operations. That is, the quantum circuit elements may be configured to make use of quantum-mechanical phenomena, such as superposition and entanglement, to perform operations on data in a non-deterministic manner. Certain quantum circuit elements, such as qubits, may be configured to represent and operate on information in more than one state simultaneously. Examples of superconducting quantum circuit elements that may be formed with the processes disclosed herein include circuit elements such as co-planar waveguides, quantum LC oscillators, qubits (e.g., flux qubits or charge qubits), superconducting quantum interference devices (SQUIDs) (e.g., RF-SQUID or DC-SQUID), inductors, capacitors, transmission lines, ground planes, among others.

In contrast, classical circuit elements generally process data in a deterministic manner. Classical circuit elements may be configured to collectively carry out instructions of a computer program by performing basic arithmetical, logical, and/or input/output operations on data, in which the data is represented in analog or digital form. In some implementations, classical circuit elements may be used to transmit data to and/or receive data from the quantum circuit elements through electrical or electromagnetic connections. Examples of classical circuit elements that may be formed with the processes disclosed herein include rapid single flux quantum (RSFQ) devices, reciprocal quantum logic (RQL) devices and ERSFQ devices, which are an energy-efficient version of RSFQ that does not use bias resistors. Other classical circuit elements may be formed with the processes disclosed herein as well.

During operation of a quantum computational system that uses superconducting quantum circuit elements and/or superconducting classical circuit elements, such as the circuit elements described herein, the superconducting circuit elements are cooled down within a cryostat to temperatures that allow a superconductor material to exhibit superconducting properties.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. For example, the actions recited in the claims can be performed in a different order and still achieve desirable results. In certain circumstances, multitasking and parallel processing may be advantageous. Moreover, the separation of various components in the implementations described above should not be understood as requiring such separation in all implementations.

A number of implementations have been described. Nevertheless, it will be understood that various modifications may be made without departing from the spirit and scope of the invention. Other implementations are within the scope of the following claims.

What is claimed is:

1. A method of fabricating a quantum circuit device, the method comprising:
   providing a device having a first layer and a second layer in contact with a surface of the first layer, wherein the second layer comprises a first superconductor material that exhibits superconducting properties at or below a corresponding superconducting critical temperature;
   forming a buffer material on a surface of the second layer to form an etch buffer layer, wherein an etch rate selectivity of the buffer material relative to the second layer upon exposure to a photoresist developer is such that the underlying second layer is not etched during exposure of the buffer layer to the photoresist developer;
   depositing and removing a selected portion of a resist layer to uncover a first portion of the etch buffer layer, wherein removing the selected portion of the resist layer comprises applying the photoresist developer to the selected portion of the resist layer;
   removing the uncovered first portion of the etch buffer layer to uncover a first portion of the second layer; and
   forming a dielectric material or a second superconductor material, which exhibits superconducting properties at or below a corresponding superconducting temperature, on the uncovered first portion of the second layer, wherein the second layer and the dielectric material or the second layer and the second superconductor material form part of the quantum circuit device, and wherein the quantum circuit device comprises a parallel plate capacitor or a microstrip resonator.

2. The method of claim 1, wherein the etch rate selectivity of the buffer material relative to the second layer upon exposure to the photoresist developer is less than 1:2.

3. The method of claim 1, wherein the first superconductor material of the second layer is aluminum.

4. The method of claim 1, wherein the buffer material comprises a polymer.

5. The method of claim 4, wherein the polymer comprises polymethylmethacrylate (PMMA).

6. The method of claim 1, wherein removing the uncovered first portion of the etch buffer layer comprises subjecting the uncovered first portion of the etch buffer layer to a dry etch.

7. The method of claim 6, wherein the dry etch comprises an $O_2$ plasma.

8. The method of claim 1, further comprising removing, subsequent to depositing the dielectric material or the second superconductor material, a remaining portion of the resist layer and the etch buffer layer.

9. The method of claim 1, wherein the first layer comprises a substrate.

10. The method of claim 9, wherein the substrate comprises a silicon wafer or a sapphire wafer.

* * * * *